United States Patent
Fukuda et al.

(10) Patent No.: US 8,293,622 B2
(45) Date of Patent: Oct. 23, 2012

(54) SEMICONDUCTOR DEVICE FABRICATION METHOD, SEMICONDUCTOR DEVICE, AND SEMICONDUCTOR LAYER FORMATION METHOD

(75) Inventors: Masahiro Fukuda, Kawasaki (JP); Yosuke Shimamune, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/120,576

(22) Filed: May 14, 2008

(65) Prior Publication Data

US 2008/0315254 A1    Dec. 25, 2008

(30) Foreign Application Priority Data

Jun. 22, 2007    (JP) .................. 2007-164727

(51) Int. Cl.
*H01L 21/20*    (2006.01)
(52) U.S. Cl. ............. 438/478; 438/285; 257/E29.193
(58) Field of Classification Search .............. 438/478, 438/285; 257/E29.193
See application file for complete search history.

(56) References Cited

U.S. PATENT DOCUMENTS

| | | | |
|---|---|---|---|
| 6,274,894 B1 | 8/2001 | Wieczorek et al. | |
| 2006/0019462 A1* | 1/2006 | Cheng et al. | 438/400 |
| 2006/0088968 A1* | 4/2006 | Shin et al. | 438/299 |
| 2006/0115933 A1 | 6/2006 | Ye et al. | |
| 2006/0260538 A1 | 11/2006 | Ye et al. | |
| 2007/0148919 A1* | 6/2007 | Lin et al. | 438/478 |
| 2007/0207596 A1* | 9/2007 | Kim et al. | 438/478 |
| 2010/0221902 A1 | 9/2010 | Ye et al. | |
| 2011/0230036 A1 | 9/2011 | Ye et al. | |

FOREIGN PATENT DOCUMENTS

| | | |
|---|---|---|
| JP | 9-92621 A | 4/1997 |
| JP | 2005-317905 A | 11/2005 |

(Continued)

OTHER PUBLICATIONS

Taiwanese Office Action dated Nov. 29, 2011, issued in corresponding Taiwanese Patent Application No. 097115686 (W/ English outline).

(Continued)

*Primary Examiner* — A. Sefer
*Assistant Examiner* — Farid Khan
(74) *Attorney, Agent, or Firm* — Westerman, Hattori, Daniels & Adrian, LLP

(57) ABSTRACT

A semiconductor device fabrication method and a semiconductor layer formation method for making a semiconductor layer having excellent morphology selectively epitaxial-grow over a semiconductor, and a semiconductor device. When a recessed source/drain pMOSFET is fabricated, a gate electrode is formed over a Si substrate in which STIs are formed with a gate insulating film therebetween (step S1). After a side wall is formed (step S2), recesses are formed in portions of the Si substrate on both sides of the side wall (step S3). A SiGe layer including a lower layer portion and an upper layer portion is formed in the recesses of the Si substrate. The lower layer portion and the upper layer portion included in the SiGe layer are made to epitaxial-grow under a condition that growth selectivity of the lower layer portion with respect to the side wall and the STIs is lower than growth selectivity of the upper layer portion with respect to the side wall and the STIs (steps S4 and S5). As a result, the SiGe layer the growth selectivity of which with respect to the side wall and the like is secured and in which morphological deterioration is suppressed can be formed in the recesses of the Si substrate.

8 Claims, 15 Drawing Sheets

FOREIGN PATENT DOCUMENTS

| | | |
|---|---|---|
| JP | 2006-173323 A | 6/2006 |
| JP | 2007-096274 A | 4/2007 |
| JP | 2007-514294 A | 5/2007 |
| JP | 2007-537601 A | 12/2007 |
| TW | 200629377 A | 8/2006 |
| TW | 200729303 A | 8/2007 |
| WO | 2005/038890 A1 | 4/2005 |
| WO | 2005/112577 A2 | 12/2005 |
| WO | 2007/023979 A1 | 3/2007 |

OTHER PUBLICATIONS

Japanese Office Action dated Aug. 7, 2012, issued in corresponding Japanese Patent Application No. 2007-164727 with an English language translation (2 pages).

* cited by examiner

SEMICONDUCTOR DEVICE FABRICATION METHOD, SEMICONDUCTOR DEVICE, AND SEMICONDUCTOR LAYER FORMATION METHOD

CROSS-REFERENCE TO RELATED APPLICATIONS

This application is based upon and claims the benefits of priority from the prior Japanese Patent Application No. 2007-164727, filed on Jun. 22, 2007, the entire contents of which are incorporated herein by reference.

BACKGROUND OF THE INVENTION (1) Field of the Invention

This invention relates to a semiconductor device fabrication method, a semiconductor device, and a semiconductor layer formation method and, more particularly, to a method for fabricating a semiconductor device having a semiconductor layer formed by epitaxial growth, such a semiconductor device, and a method for forming a semiconductor layer by the epitaxial growth.

(2) Description of the Related Art

In recent years attention has been riveted on what is called a recessed source/drain MOS field-effect transistor (MOSFET) in which a semiconductor layer that differs from a semiconductor substrate in lattice constant is formed in recesses formed in the semiconductor substrate as source/drain regions. Such a recessed source/drain MOSFET has become important as a technique for improving the performance of transistors beyond the 90 nm node.

If a silicon (Si) substrate is used in a recessed source/drain MOSFET as a semiconductor substrate, a silicon germanium (SiGe) layer or a silicon carbide (SiC) layer is used in many cases as source/drain regions according to the channel type of the MOSFET. If a SiGe layer, for example, is used as source/drain regions, compression distortion is caused in a channel region between the source/drain regions because the lattice constant of SiGe is greater than the lattice constant of Si. This improves hole mobility in the channel region. Therefore, the current driving capability of a p-channel MOSFET (pMOSFET) can be enhanced significantly.

Such a SiGe layer, for example, is formed by performing selective epitaxial growth in recesses formed in a Si substrate. In this case, the formation of the SiGe layer over insulating layers, such as shallow trench isolations (STIs) and a side wall, is suppressed. Conventionally, a chemical vapor deposition (CVD) method has widely been used for making such a SiGe layer, for example, selectively grow. In this case, a method in which Si material gas, germanium (Ge) material gas, and the like and halogen gas, such as hydrogen chloride (HCl) gas, are added is proposed.

The higher temperature at which a SiGe layer or the like grows becomes, the thinner the critical thickness of the SiGe layer gets. As a result, a misfit dislocation tends to appear in the SiGe layer. When a misfit dislocation appears, the distortion mitigates and stress applied to the channel region weakens. In addition, growth at a high temperature causes the diffusion of impurities contained in the semiconductor substrate. This has a bad influence on device characteristics. For example, a roll-off characteristic deteriorates. As transistors grow minuter and channels become shorter, such a bad influence on device characteristics becomes significant. To avoid these problems, a low-temperature process in which a SiGe layer is made to grow at a lower temperature is required.

For example, one possible method for making a SiGe layer of a MOSFET grow by the CVD method is as follows. When a SiGe layer is made to grow over a Si layer which is exposed with insulating layers such as a side wall and STIs or insulating layers for masking, halogen gas is added to Si material gas and Ge material gas. In this case, an increase in the content of halogen gas improves the growth selectivity of the SiGe layer over the Si layer with respect to the insulating layers. However, if the content of halogen gas is increased, that is to say, if the condition that the growth selectivity of the SiGe layer over the Si layer becomes higher is used, morphology deteriorates. For example, a partial delay in the growth of the SiGe layer occurs. This morphological deterioration largely depends on temperature at which the SiGe layer grows, and tends to occur when the SiGe layer grows at a low temperature. Such morphological deterioration has a great influence on the electrical characteristics of the MOSFET and, more particularly, on variation in the electrical characteristics of the MOSFET.

As stated above, when the SiGe layer is made to grow by adding halogen gas, there is a trade-off relationship between growth selectivity and morphology. The same applies to the case where a SiC layer, for example, is made to grow. Therefore, a technique for enabling the selective growth of a semiconductor layer, such as a SiGe layer or a SiC layer, and suppression of morphological deterioration at a low temperature and for stably fabricating a recessed source/drain MOSFET having excellent characteristics is desperately needed.

SUMMARY OF THE INVENTION

According to an aspect of the invention, a method of manufacturing a semiconductor device includes forming a gate electrode over a first semiconductor layer with a gate insulating film therebetween, forming an insulating layer over sides of the gate electrode, forming recesses in the first semiconductor layer over both sides of the insulating layer, and forming a second semiconductor layer having a lower layer portion and an upper layer portion in the recesses, the lower layer portion and the upper layer portion being made to grow under a condition that growth selectivity of the lower layer portion with respect to the insulating layer is lower than growth selectivity of the upper layer portion with respect to the insulating layer.

DESCRIPTION OF THE PREFERRED EMBODIMENTS

Embodiments of the present invention will now be described in detail with reference to the drawings.

First, description will be given with a pMOSFET as an example.

Figure 1:
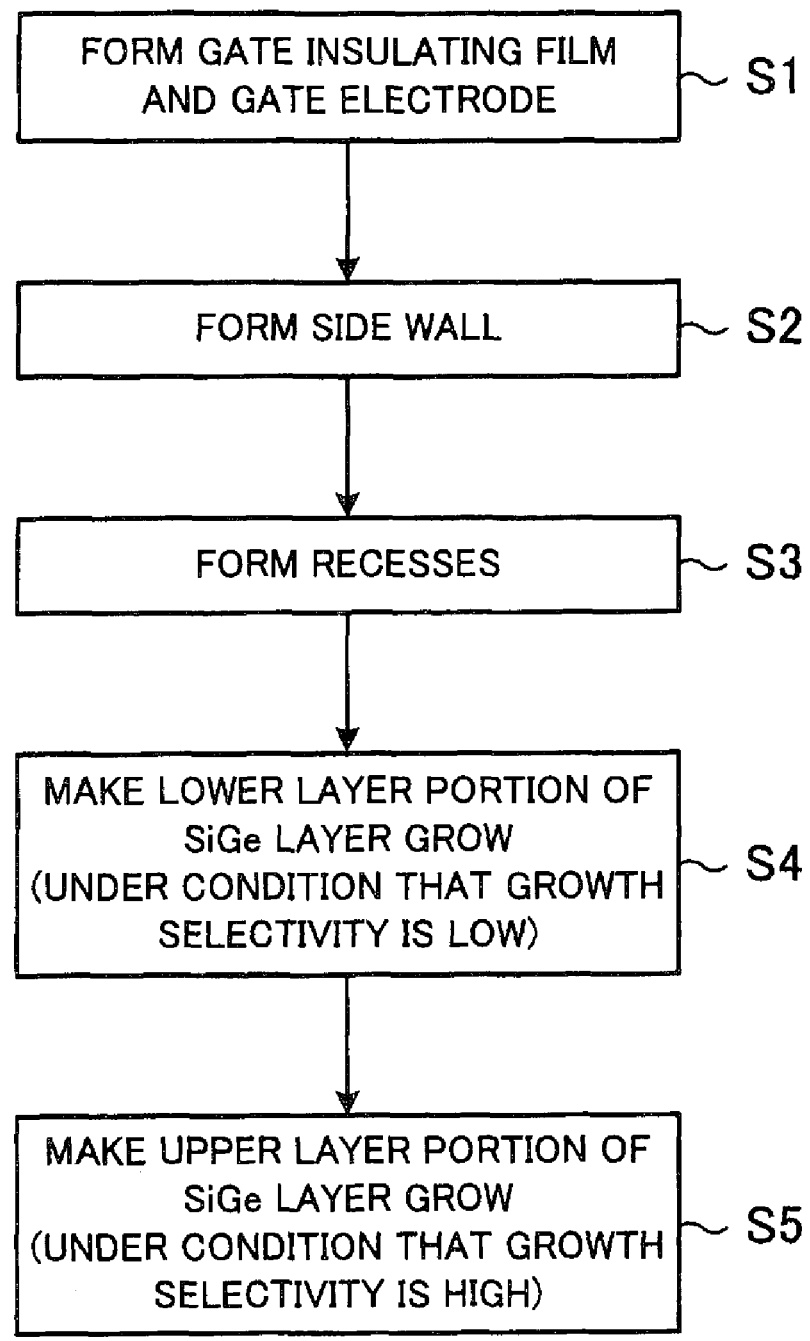
FIG. 1 is a view showing an example of a flow chart of fabricating a pMOSFET.
Figure 2:
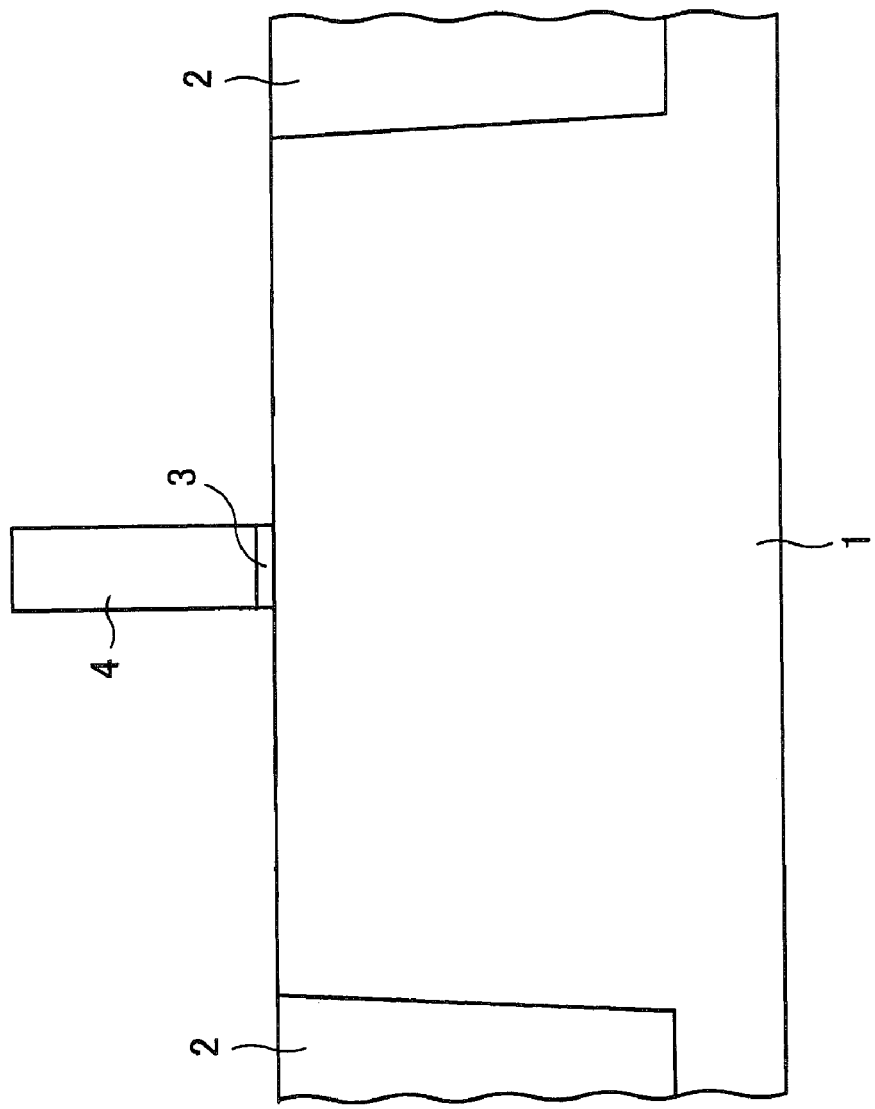
FIG. 2 is a fragmentary schematic sectional view showing the step of forming a gate electrode.
Figure 3:
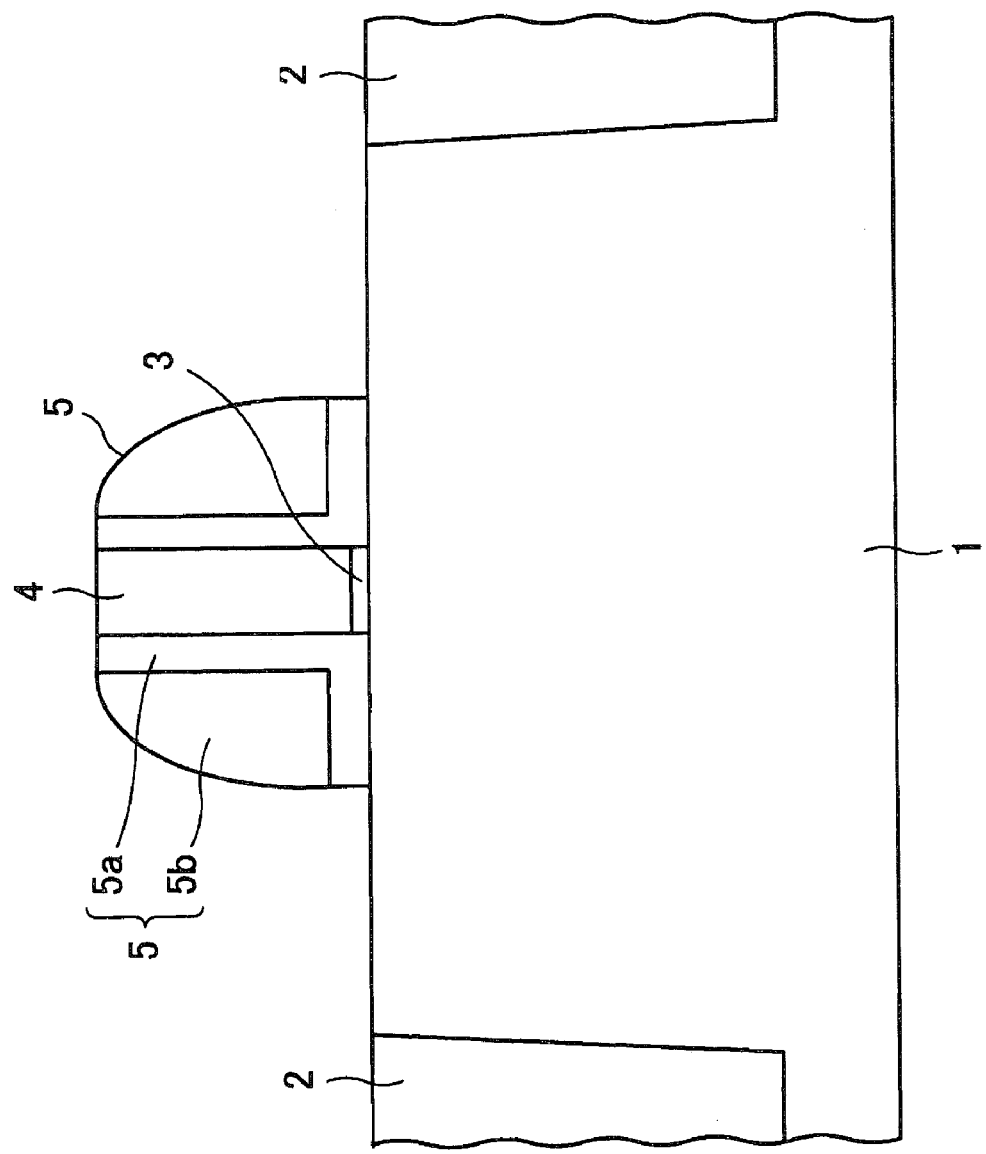
FIG. 3 is a fragmentary schematic sectional view showing the step of forming a side wall.
Figure 4:
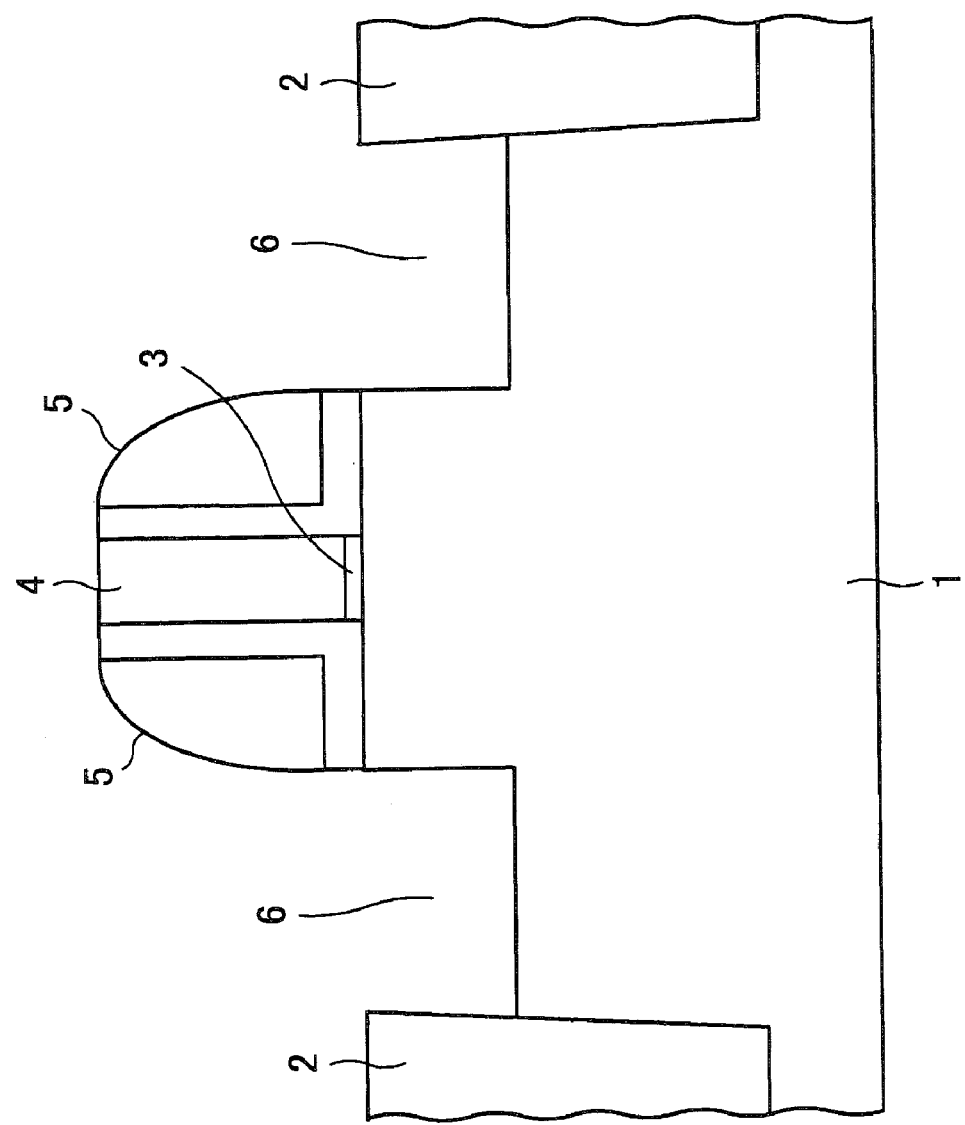
FIG. 4 is a fragmentary schematic sectional view showing the step of forming a recess.
Figure 5:
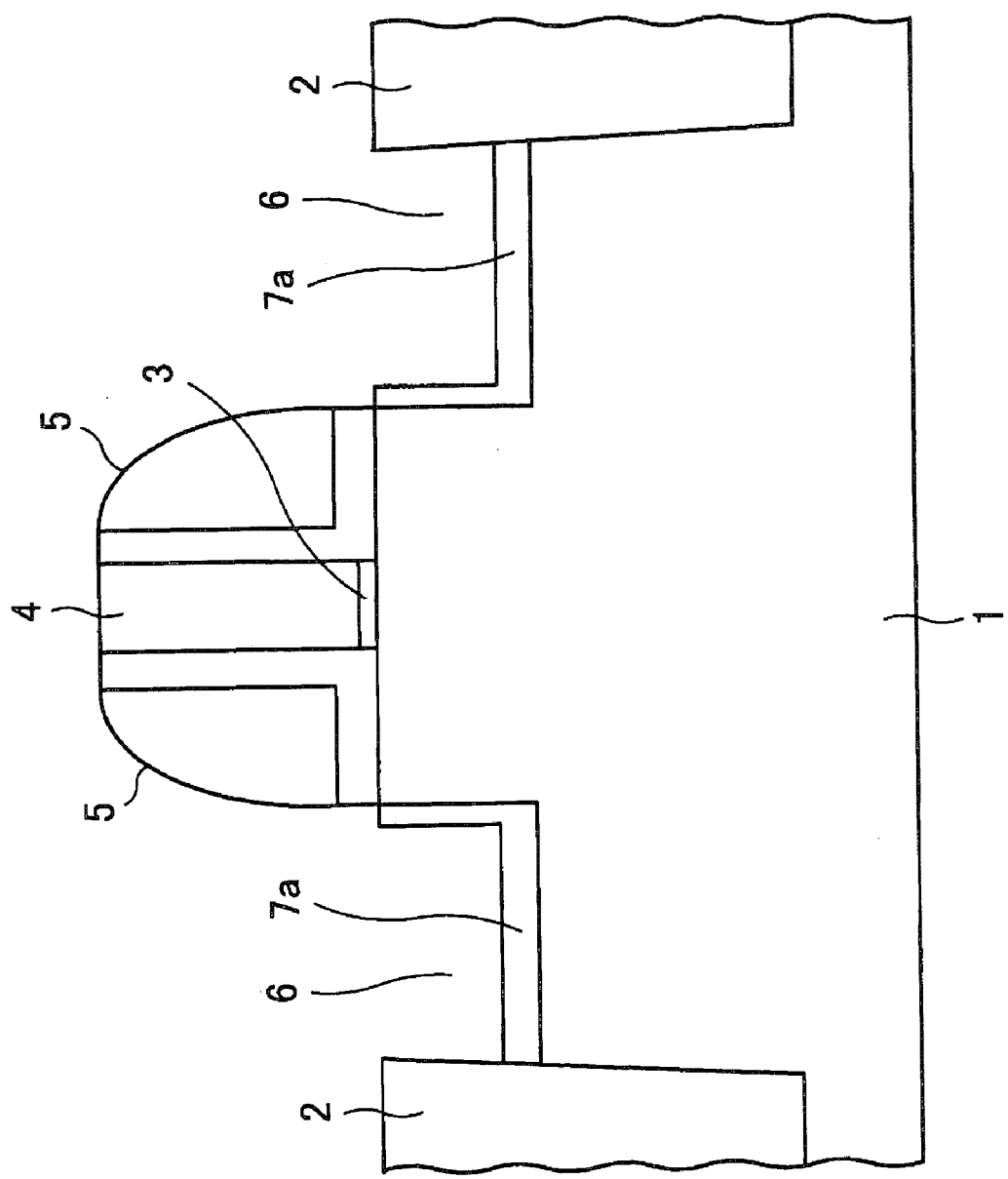
FIG. 5 is a fragmentary schematic sectional view showing the step of forming source/drain regions (part 1).
Figure 6:
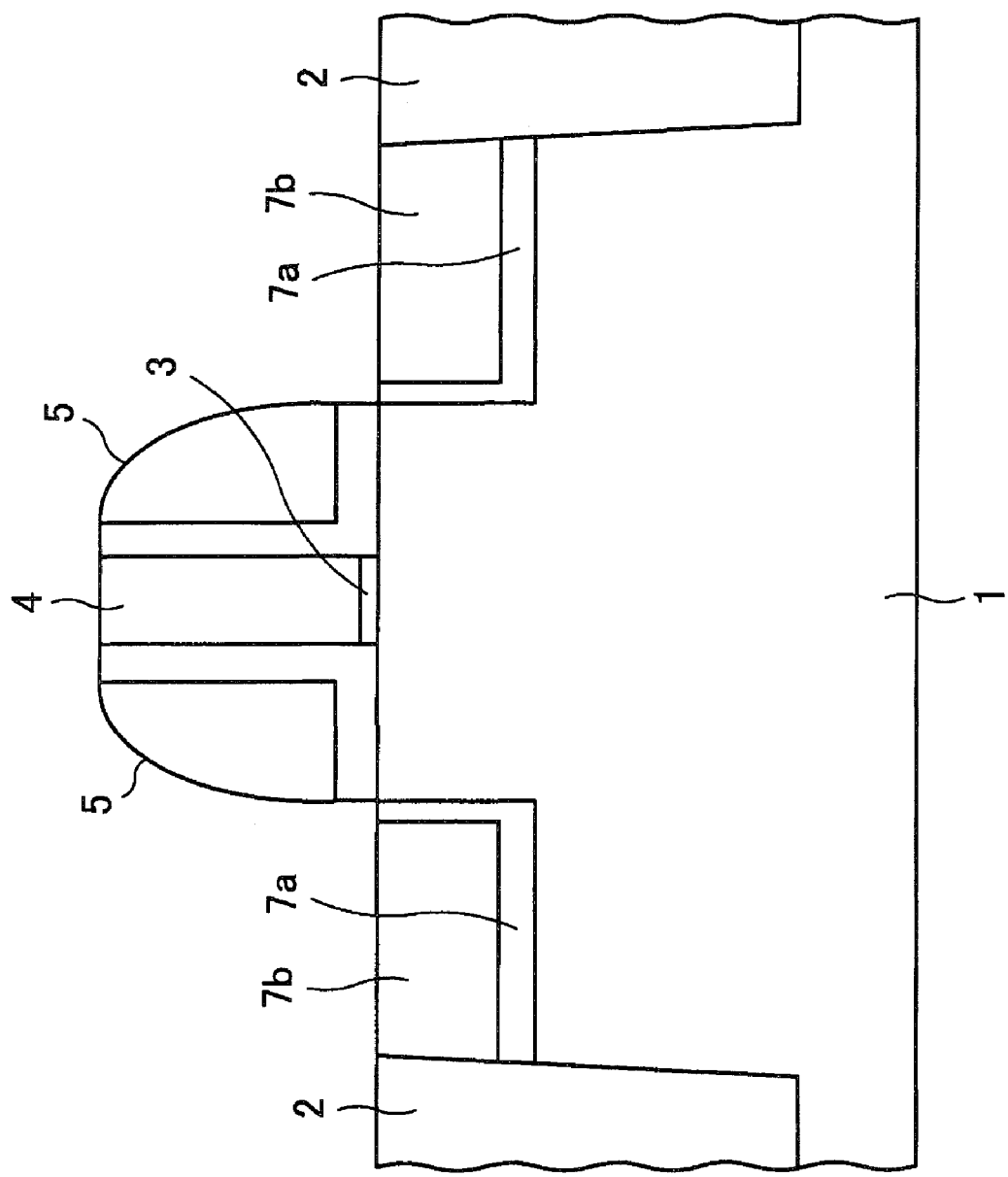
FIG. 6 is a fragmentary schematic sectional view showing the step of forming the source/drain regions (part 2).

FIG. 1 is a view showing an example of a flow chart of fabricating a pMOSFET. Each of FIGS. 2 through 6 is a view for describing a step of fabricating the pMOSFET. FIG. 2 is a fragmentary schematic sectional view showing the step of forming a gate electrode. FIG. 3 is a fragmentary schematic sectional view showing the step of forming a side wall. FIG. 4 is a fragmentary schematic sectional view showing the step of forming a recess. FIG. 5 is a fragmentary schematic sectional view showing the step of forming source/drain regions (part 1). FIG. 6 is a fragmentary schematic sectional view showing the step of forming the source/drain regions (part 2). Description will be given in accordance with the order of the drawings.

As shown in FIG. 2, STIs 2 are formed first in a Si substrate 1. A gate electrode 4 is formed over an element region of the Si substrate 1 defined by the STIs 2 with a gate insulating film 3 therebetween (step S1).

For example, a silicon oxide (SiO) film, a silicon nitride (SiN) film, or a silicon oxide nitride (SiON) film with a thickness of 1 to 2 nm may be formed as the gate insulating film 3. The gate electrode 4 can be formed by the use of, for example, polycrystalline silicon which contains p-type impurities such as boron (B). After the SiO film and polycrystalline silicon are formed over an entire surface of the Si substrate 1, predetermined patterning is performed by etching to form the gate insulating film 3 and the gate electrode 4. In order to adjust a threshold, the Si substrate 1 may be doped with predetermined conduction impurities before the formation of the gate insulating film 3 or after the formation of the gate insulating film 3 (before the patterning) as occasion arises.

After the gate electrode 4 is formed, one or more layers of an insulating film, such as a SiO film, a SiN film, or a SiON film, are formed over an entire surface and an etch-back is performed. As a result, as shown in FIG. 3, a side wall 5 is formed on the gate electrode 4 (step S2). In this example, the side wall 5 has a two-layer structure (side walls 5a and 5b).

As shown in FIG. 4, recesses 6 with a predetermined depth are formed in portions of the Si substrate 1 on both sides of the side wall 5 by, for example, dry etching after the side wall 5 is formed (step S3).

After the recesses 6 are formed, a semiconductor layer to be used as the source/drain regions is made to epitaxial-grow in the recesses 6 by the CVD method (steps S4 and S5). In this example, a SiGe layer which differs from the Si substrate 1 in lattice constant is made to epitaxial-grow.

For example, a SiGe layer is made to epitaxial-grow in the recesses 6 by the use of mixed gas which contains Si material gas, Ge material gas, halogen gas used for controlling growth selectivity, carrier gas which is hydrogen ($H_2$) gas or an inert gas such as nitrogen ($N_2$) gas or helium (He) gas, and the like at a growth temperature (substrate temperature) of 450 to 600° C. Silane ($SiH_4$) gas, disilane ($Si_2H_6$) gas, dichlorosilane ($SiH_2Cl_2$) gas, or the like may be used as Si material gas. Germane ($GeH_4$) gas, digermane ($Ge_2H_6$) gas, or the like may be used as Ge material gas. Gas, such as HCl gas, hydrogen bromide (HBr) gas, chlorine ($Cl_2$) gas, or bromine ($Br_2$) gas, which contains a halogen element may be used as halogen gas.

At the same time that the SiGe layer is made to epitaxial-grow, the doping of p-type impurities such as boron (B) may be performed (in-situ doping method). In this case, diborane ($B_2H_6$) gas or the like which is a p-type impurity material is added to the mixed gas used for epitaxial growth. The details of impurity doping will be described later.

The SiGe layer is made to selectively grow in the recesses 6 of the Si substrate 1 with respect to insulating layers, such as the side wall 5 and the STIs 12, which are exposed at the beginning of epitaxial growth. Accordingly, as shown in FIG. 5, a lower layer portion 7a is made to grow first in the recesses 6 under the condition that growth selectivity with respect to insulating layers such as the side wall 5 is comparatively low (step S4). As shown in FIG. 6, an upper layer portion 7b is made to grow next on the lower layer portion 7a under the condition that growth selectivity with respect to the insulating layers such as the side wall 5 is comparatively high (step S5). The thickness of the lower layer portion 7a can be set to, for example, 1 to 50 nm according to the final thickness of the SiGe layer. The thickness of the upper layer portion 7b can be set to, for example, 10 to 50 nm according to the final thickness of the SiGe layer.

When the lower layer portion 7a and the upper layer portion 7b are made to grow in the recesses 6 in this way, growth selectivity with respect to insulating layers such as the side wall 5 can be controlled by halogen gas content at epitaxial growth time or growth temperature.

Control of the growth selectivity of the lower layer portion 7a and the upper layer portion 7b of the SiGe layer will now be described.

It is assumed that the SiGe layer is formed by using a low pressure CVD method, using $SiH_4$ gas as Si material gas, using $GeH_4$ gas as Ge material gas, using HCl gas as halogen gas, using $B_2H_6$ gas as p-type impurity material gas, and using $H_2$ gas as carrier gas.

Substrate temperature at epitaxial growth time is set to 450 to 600° C. Total pressure is set to 5 to 1,330 Pa and the partial pressure of HCl gas is set to 1 to 5 Pa. The partial pressure of SiH$_4$ gas is set to 1 to 10 Pa and the partial pressure of GeH$_4$ gas is set to 0.1 to 10 Pa. If B$_2$H$_6$ gas is used as p-type impurity material gas, the partial pressure of B$_2$H$_6$ gas is set to $1\times10^{-5}$ to $1\times10^{-2}$ Pa.

Controlling the growth selectivity of the SiGe layer by controlling a halogen gas content will be described first. For example, HCl gas is used as halogen gas.

Figure 7:
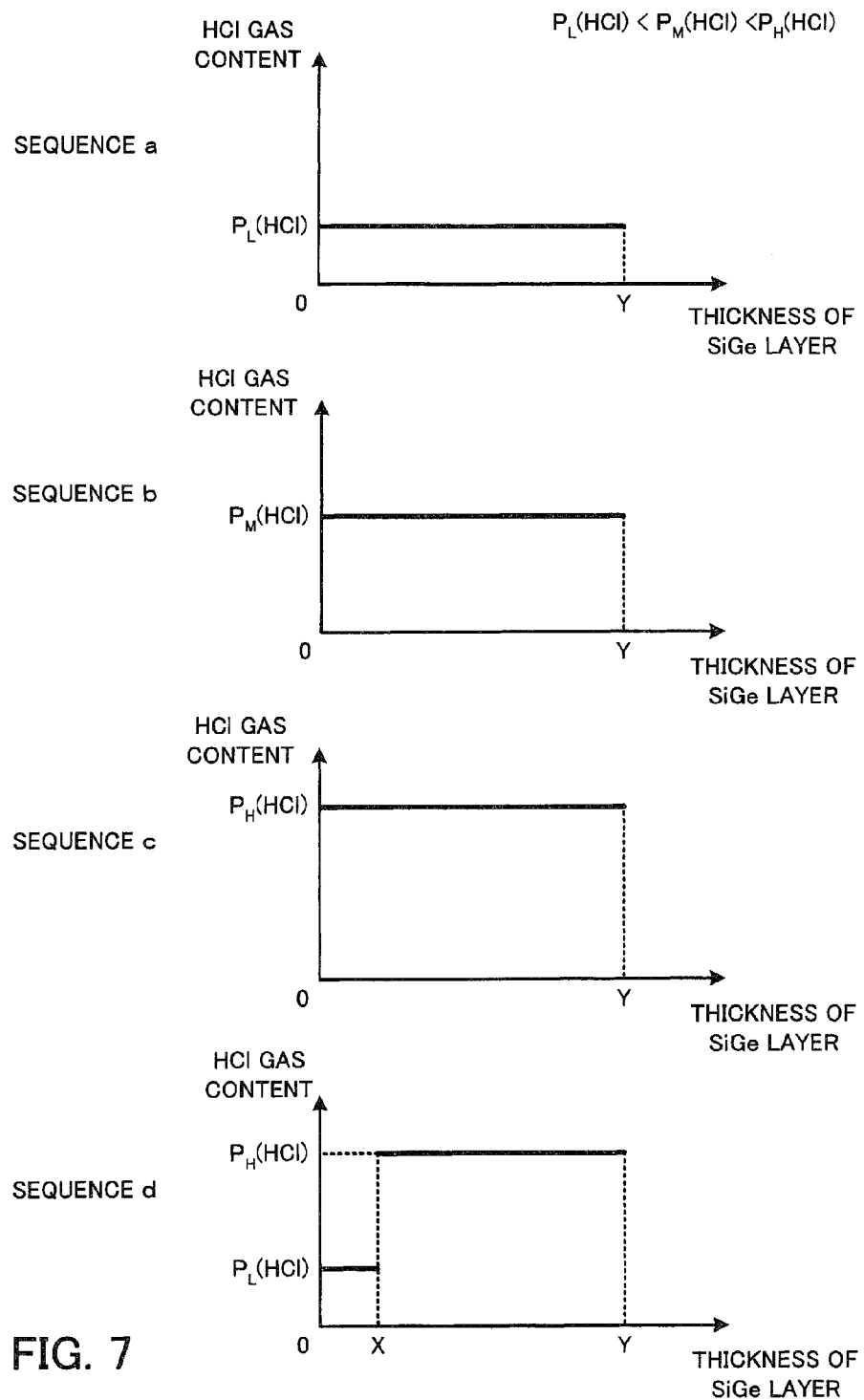
FIG. 7 is a view showing examples of the sequence of an HCl gas content at the time of the growth of a SiGe layer.

FIG. 7 is a view showing examples of the sequence of an HCl gas content at the time of the growth of a SiGe layer.

With sequences a through c shown in FIG. 7, the thicknesses Y of SiGe layers are the same. With the sequence a, an HCl gas content (partial pressure) at growth time is P$_L$ (HCl) and is constant. With the sequence b, an HCl gas content (partial pressure) at growth time is P$_M$ (HCl) and is constant. With the sequence c, an HCl gas content (partial pressure) at growth time is P$_H$ (HCl) and is constant. The relationship P$_L$ (HCl)<P$_M$ (HCl)<P$_H$ (HCl) exists among the HCl gas content P$_L$ (HCl), the HCl gas content P$_M$ (HCl), and the HCl gas content P$_H$ (HCl). If SiGe layers the thicknesses Y of which are, for example, 70 nm are made to grow, it is desirable that the HCl gas content of mixed gas which contains Si material gas, Ge material gas, p-type impurity material gas, HCl gas, and carrier gas should be set to P$_L$ (HCl)=0-3 Pa, P$_M$ (HCl)= 2.5-3.5 Pa, and P$_H$ (HCl)=3-5 Pa. In this case, the HCl gas content of mixed gas is set to P$_L$ (HCl)=2.62 Pa, P$_M$ (HCl)= 2.88 Pa, and P$_H$ (HCl)=3.27 Pa (partial pressure of each material gas contained in mixed gas and the total pressure of mixed gas are constant).

A sequence d shown in FIG. 7 is applied to the pMOSFET fabrication process shown in FIGS. 1 through 6. With the sequence d, the lower layer portion 7a and the upper layer portion 7b are made to grow by changing an HCl gas content. By doing so, a SiGe layer with a total thickness of Y is made to grow. When the lower layer portion 7a with a thickness of X is made to grow, an HCl gas content is set to P$_L$ (HCl). When the upper layer portion 7b with a thickness of (Y−X) is made to grow, an HCl gas content is set to P$_H$ (HCl). For example, the lower layer portion 7a with a thickness of X=5 nm and the upper layer portion 7b with a thickness of (Y−X)=65 nm are made to grow and a SiGe layer with a total thickness of Y=70 nm is made to grow. In this case, the HCl gas content of mixed gas is set to P$_L$ (HCl)=2.62 Pa and P$_H$ (HCl)=3.27 Pa (partial pressures of Si material gas and Ge material gas contained in mixed gas and the total pressure of mixed gas are constant).

SEM images of surfaces which are formed after the growth of the SiGe layers by the sequences a through d shown in FIG. 7 are shown in FIGS. 8 and 9.

Figure 8A:
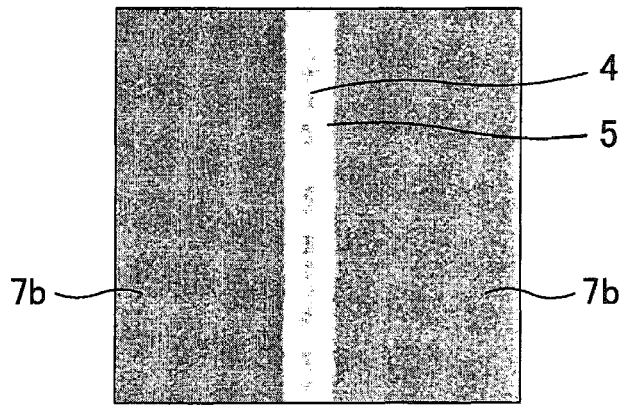
FIGS. 8A, 8B, 8C, and 8D are views showing images of surfaces near gate electrodes after the growth of SiGe layers, FIG. 8A being a view showing an image obtained when a sequence a is used for making a SiGe layer grow, FIG. 8B being a view showing an image obtained when a sequence b is used for making a SiGe layer grow, FIG. 8C being a view showing an image obtained when a sequence c is used for making a SiGe layer grow, and FIG. 8D being a view showing an image obtained when a sequence d is used for making a SiGe layer grow.
Figure 8B:
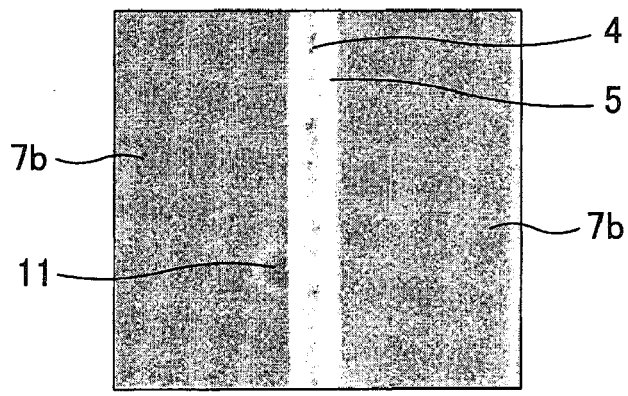
Figure 8C:
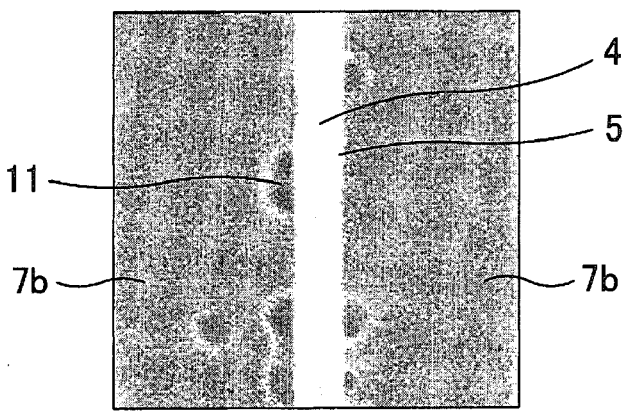
Figure 8D:
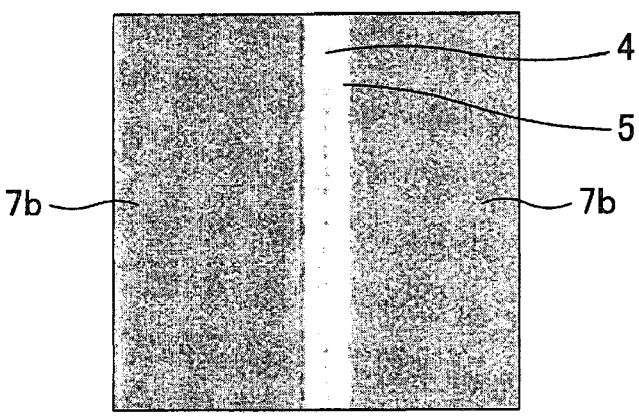
Figure 9A:
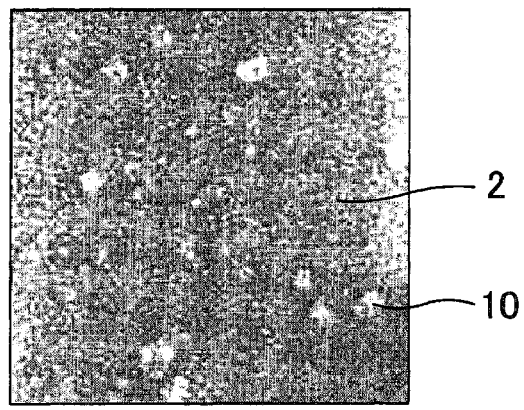
FIGS. 9A, 9B, 9C, and 9D are views showing images of the surfaces of STIs after the growth of SiGe layers, FIG. 9A being a view showing an image obtained when the sequence a is used for making a SiGe layer grow, FIG. 9B being a view showing an image obtained when the sequence b is used for making a SiGe layer grow, FIG. 9C being a view showing an image obtained when the sequence c is used for making a SiGe layer grow, and FIG. 9D being a view showing an image obtained when the sequence d is used for making a SiGe layer grow.
Figure 9B:
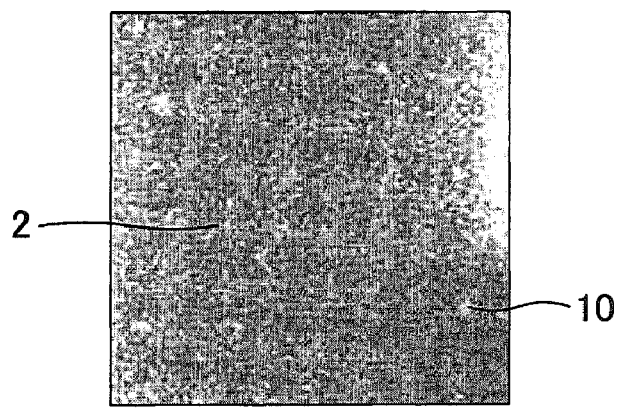
Figure 9C:
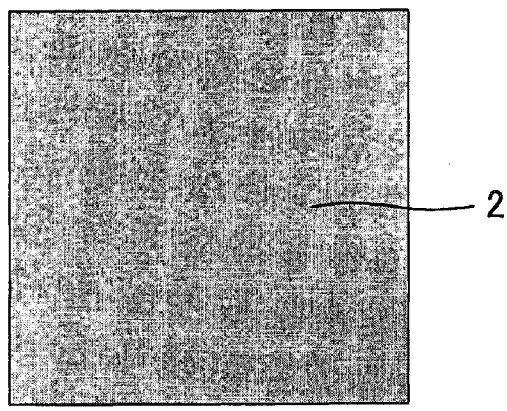
Figure 9D:
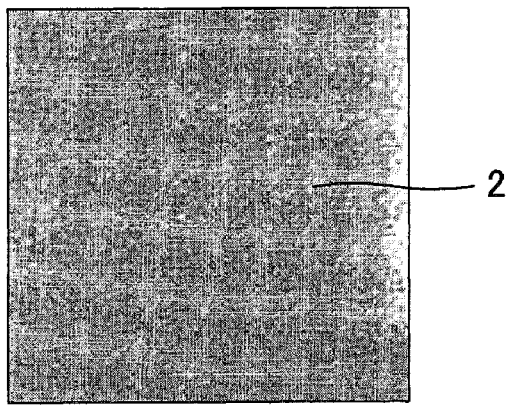

FIGS. 8A, 8B, 8C, and 8D are views showing images of surfaces near gate electrodes after the growth of the SiGe layers. FIG. 8A is a view showing an image obtained when the sequence a is used for making the SiGe layer grow. FIG. 8B is a view showing an image obtained when the sequence b is used for making the SiGe layer grow. FIG. 8C is a view showing an image obtained when the sequence c is used for making the SiGe layer grow. FIG. 8D is a view showing an image obtained when the sequence d is used for making the SiGe layer grow. FIGS. 9A, 9B, 9C, and 9D are views showing images of the surfaces of STIs after the growth of the SiGe layers. FIG. 9A is a view showing an image obtained when the sequence a is used for making the SiGe layer grow. FIG. 9B is a view showing an image obtained when the sequence b is used for making the SiGe layer grow. FIG. 9C is a view showing an image obtained when the sequence c is used for making the SiGe layer grow. FIG. 9D is a view showing an image obtained when the sequence d is used for making the SiGe layer grow.

With the sequence a shown in FIG. 7, an HCl gas content is low (P$_L$ (HCl)). When a SiGe layer is made to grow over the Si substrate 1 under this condition, morphological deterioration is suppressed as shown in FIG. 8A. As shown in FIG. 9A, however, SiGe particles 10 tend to grow on the STI 2. Such SiGe particles 10 are also formed on the side wall 5. In this case, a leakage current tends to flow between the gate electrode 4 and the source/drain regions (SiGe layer).

With the sequence b or c shown in FIG. 7, an HCl gas content is higher (P$_M$ (HCl) or P$_H$ (HCl)). When a SiGe layer is made to grow over the Si substrate 1 under this condition, morphological deterioration occurs in some spots (morphological deterioration spots 11) as shown in FIG. 8B or 8C. On the other hand, however, the formation of the SiGe particles 10 on the STI 2 or the side wall 5 is suppressed as shown in FIG. 9B or 9C.

The appearance of the morphological deterioration spots 11 must be suppressed in a SiGe layer. In addition, it is necessary to make the SiGe layer selectively grow over the Si substrate 1 (in the recesses 6), while suppressing the formation of the SiGe particles 10 on insulating layers such as the side wall 5. As stated above, however, it is difficult to realize these two purposes at the same time by using the sequences a through c.

With the sequence d shown in FIG. 7, an HCL gas content is low (P$_L$ (HCl)) in the early stages of the growth of the SiGe layer (in the stages of the growth of the lower layer portion 7a) and then becomes high (P$_H$ (HCl)). By adopting these conditions, as shown in FIG. 8D, appearance of the morphological deterioration spots 11 can be suppressed. In addition, as shown in FIG. 9D, it is possible to make the SiGe layer selectively grow over the Si substrate 1 (in the recesses 6), while suppressing the formation of the SiGe particles 10 on insulating layers such as the side wall 5.

The morphology of a SiGe layer is significantly influenced by the morphology of the SiGe layer in the early stages of its growth.

Before a SiGe layer is made to grow, usually cleaning is performed by the use of hydrogen fluoride (HF). By doing so, the Si substrate 1 is cleaned and Si atoms at the surface thereof are terminated by hydrogen. In some cases, however, not all contaminants, for example, are removed by the cleaning and some of them remain. In addition, as time for which the Si substrate 1 is exposed to the air after the cleaning and before the growth of the SiGe layer lengthens, the possibility that contaminants and the like stick thereto becomes stronger. Moreover, there are cases where a crystal defect potentially exists in the Si substrate 1 or where a crystal defect caused in the process for fabricating the pMOSFET exists in the Si substrate 1.

If an HCL gas content is high at the time of making the SiGe layer grow over this Si substrate 1 (sequence b or c), growth selectivity becomes high. Accordingly, a growth delay tends to occur at a place where a contaminant sticks or where a crystal defect exists even in the early stages of the growth, compared with a clean portion of the Si substrate 1. If the SiGe layer continues to grow, the growth delay remains in an upper layer.

If an HCL gas content is made lower (sequence a or b), the growth selectivity of the SiGe layer becomes lower. Accordingly, morphological deterioration is suppressed in the early stages of the growth. If the SiGe layer continues to grow, morphological deterioration can be suppressed in the final SiGe layer. However, if the SiGe layer is made to grow under the condition that growth selectivity is low, SiGe particles are formed on insulating layers such as the side wall 5.

If an HCL gas content is made low in the early stages of the growth of the SiGe layer and is then made high (sequence d), morphological deterioration is suppressed in the lower layer portion 7a which is made to grow in the early stages. After that, the upper layer portion 7b is made to grow with high growth selectivity. As a result, the SiGe layer in which morphological deterioration is suppressed can be obtained. In addition, the upper layer portion 7b is made to grow with such high growth selectivity, so the formation of SiGe particles on the side wall 5 and the like can be suppressed.

By controlling an HCL gas content in a manner like that shown by the sequence d at the time of the growth of the SiGe layer, suppression of morphological deterioration and selective growth can be realized at the same time. In addition, by controlling an HCL gas content in this way, the SiGe layer in which the concentration of Cl atoms contained in the lower layer portion 7a is lower than the concentration of Cl atoms contained in the upper layer portion 7b can be obtained.

By the way, the SiGe layer is doped with p-type impurities such as boron (B) in order to use the SiGe layer as the source/drain regions. As stated above, the SiGe layer can be doped with p-type impurities simultaneously with the growth of the SiGe layer by adding p-type impurity material gas ($B_2H_6$ gas or the like) to mixed gas which contains Si material gas, Ge material gas, and HCl gas (in-situ doping method).

A profile of the concentration of the p-type impurities in the SiGe layer has an influence on the electrical characteristics of the pMOSFET. If the concentration of p-type impurities near the channel region under the gate electrode 4 is high, the roll-off characteristic deteriorates because of impurity diffusion caused by a thermal load in the process for fabricating the pMOSFET. Therefore, such a concentration profile must be taken into consideration at the time of the growth of the SiGe layer.

If a p-type impurity material gas content is constant at the time of the growth of the SiGe layer in the in-situ doping method, a change in HCl gas content causes a change in the concentration of p-type impurities contained in the SiGe layer. To be concrete, the lower an HCl gas content becomes, the higher the concentration of p-type impurities contained in the SiGe layer gets.

Figure 10:
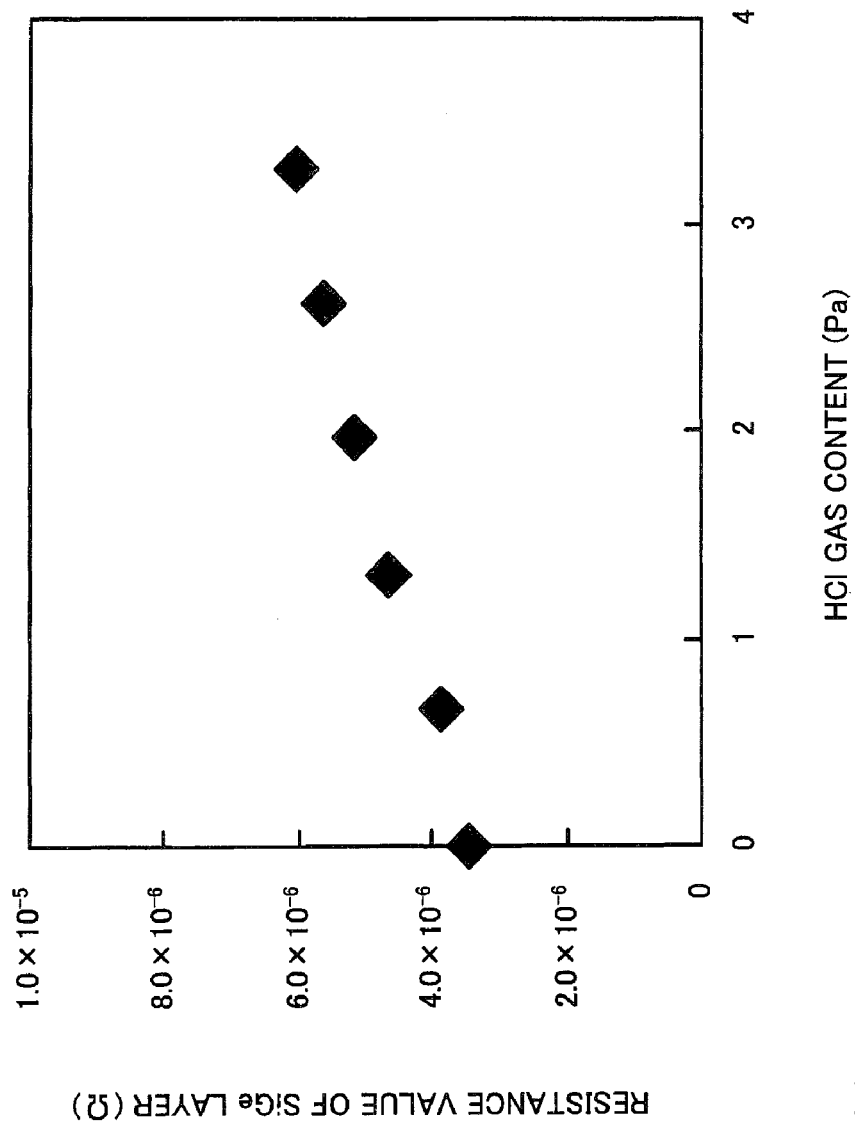
FIG. 10 is a view showing the relationship between an HCl gas content at the time of the growth of a SiGe layer and the resistance value of the SiGe layer.

FIG. 10 is a view showing the relationship between an HCl gas content at the time of the growth of a SiGe layer and the resistance value of the SiGe layer.

In FIG. 10, mixed gas contains Si material gas, Ge material gas, p-type impurity material gas, HCl gas, and carrier gas. The partial pressures of Si material gas, Ge material gas, and p-type impurity material gas and the total pressure of mixed gas are made constant and an HCl gas content (partial pressure of HCl gas) is changed. By doing so, SiGe layers are made to grow over Si substrates. The thickness of a SiGe layer made to grow under each condition is constant. As can be seen from FIG. 10, as an HCl gas content becomes lower at the time of the growth of a SiGe layer, the resistance value of the SiGe layer made to grow decreases. That is to say, the concentration of p-type impurities increases with a decrease in HCl gas content under the condition that a p-type impurity material gas content is constant.

As stated above, it is assumed that a SiGe layer includes the lower layer portion 7a and the upper layer portion 7b. These results mean that if a p-type impurity material gas content is constant, an HCl gas content is made low at the time of the growth of the lower layer portion 7a, and an HCl gas content is made high at the time of the growth of the upper layer portion 7b, the concentration of p-type impurities contained in the lower layer portion 7a increases. If the concentration of p-type impurities contained in the lower layer portion 7a increases, there is a possibility that a roll-off characteristic deteriorates. As a device becomes minuter and a channel of a pMOSFET becomes shorter, this possibility gets stronger.

Accordingly, in addition to the above control of an HCL gas content, control of the content of a p-type impurity material gas such as $B_2H_6$ gas is exercised at the time of the growth of a SiGe layer.

Figure 11:
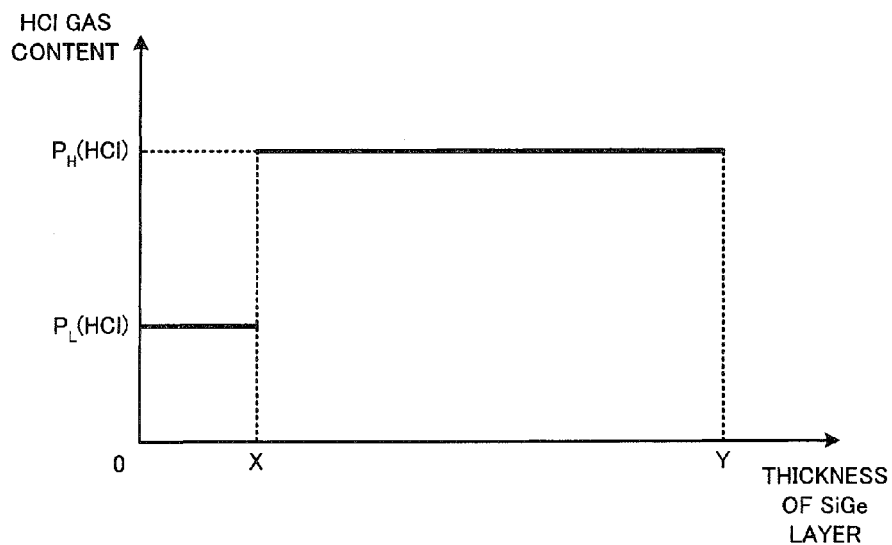
FIG. 11 is a view showing first examples of the sequences of an HCl gas content and a $B_2H_6$ gas content at the time of the growth of a SiGe layer.
Figure 11:
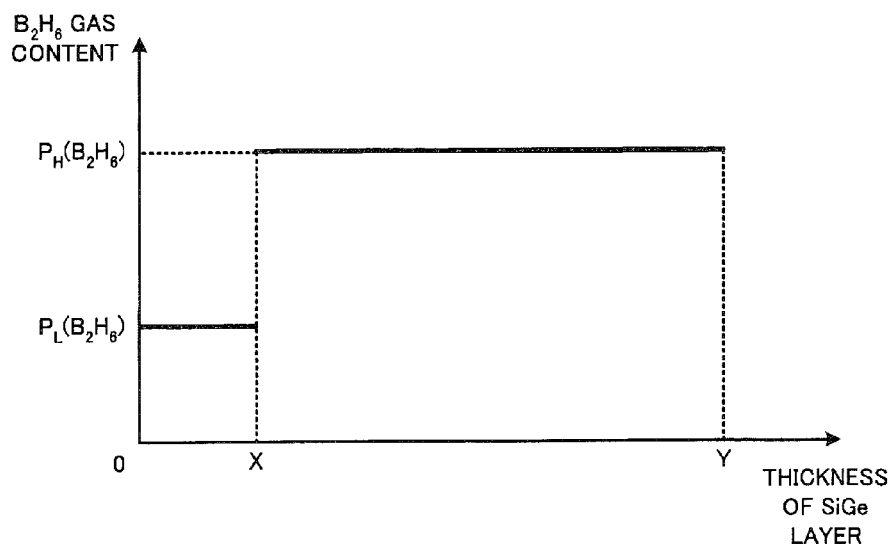

FIG. 11 is a view showing first examples of the sequences of an HCl gas content and a $B_2H_6$ gas content at the time of the growth of a SiGe layer.

The following sequence is used for an HCL gas content (partial pressure of HCl gas). An HCL gas content is set to a low value ($P_L$ (HCl)) in the early stages of the growth of a SiGe layer (in the stages of the growth of the lower layer portion 7a with a thickness of X) and is set to a high value ($P_H$ (HCl)) in later stages (in the stages of the growth of the upper layer portion 7b with a thickness of (Y−X)). This sequence is like the above sequence d.

In accordance with the above information the following sequence, together with this sequence of an HCL gas content, is used for a $B_2H_6$ gas content (partial pressure of $B_2H_6$ gas). A $B_2H_6$ gas content is set to a low value ($P_L$ ($B_2H_6$)) in the early stages of the growth of the SiGe layer (in the stages of the growth of the lower layer portion 7a with a thickness of X) and is set to a high value ($P_H$ ($B_2H_6$)) in the later stages (in the stages of the growth of the upper layer portion 7b with a thickness of (Y−X)).

For example, the lower layer portion 7a with a thickness of X=5 nm and the upper layer portion 7b with a thickness of (Y−X)=65 nm are made to grow and therefore a SiGe layer with a total thickness of Y=70 nm is made to grow. In this case, the HCl gas content of mixed gas is set to $P_L$ (HCl)=2.62 Pa and $P_H$ (HCl)=3.27 Pa. A $B_2H_6$ gas content (partial pressure of $B_2H_6$ gas) is controlled so that the concentration of boron (B) contained in the upper layer portion 7b will be $1 \times 10^{19}$ to $1 \times 10^{21}$ atoms/cm$^3$ and so that the concentration of boron (B) contained in the lower layer portion 7a will be lower than the concentration of boron (B) contained in the upper layer portion 7b (partial pressures of Si material gas and Ge material gas contained in mixed gas and the total pressure of mixed gas are constant).

As stated above, a $B_2H_6$ gas content is made low at the time of an HCL gas content being low and is made high at the time of an HCL gas content being high. By doing so, a concentration profile of a SiGe layer in which the concentration of boron (B) contained in a portion near the Si substrate 1 is low can be obtained. Accordingly, the degree of boron (B) diffusion caused by a thermal load can be made small and deterioration in a roll-off characteristic can be suppressed. By using the sequences shown in FIG. 11, deterioration in the roll-off characteristic can be suppressed. In addition, it is possible to make the SiGe layer selectively grow, while suppressing morphological deterioration.

An HCL gas content and a $B_2H_6$ gas content can be controlled by using the sequences shown in FIG. 11. In addition, an HCL gas content and a $B_2H_6$ gas content may be controlled by using sequences shown in FIG. 12, 13, or 14.

Figure 12:
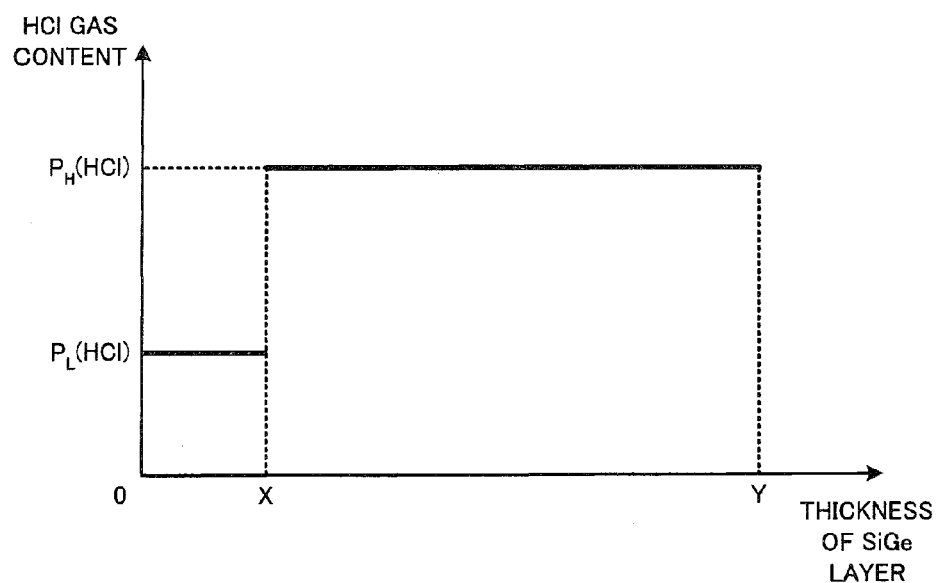
FIG. 12 is a view showing second examples of the sequences of an HCl gas content and a $B_2H_6$ gas content at the time of the growth of a SiGe layer.
Figure 12:
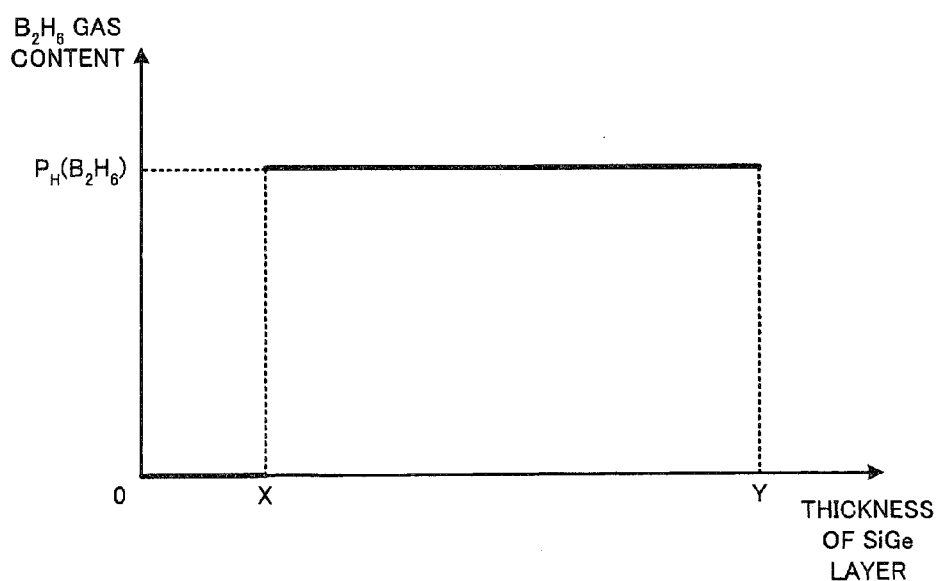
Figure 13:
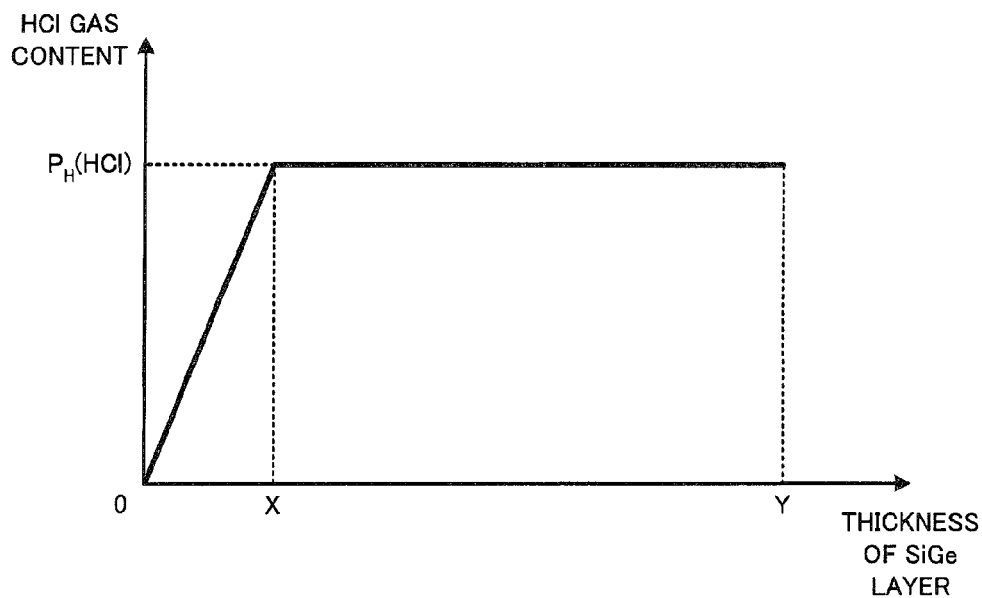
FIG. 13 is a view showing third examples of the sequences of an HCl gas content and a $B_2H_6$ gas content at the time of the growth of a SiGe layer.
Figure 13:
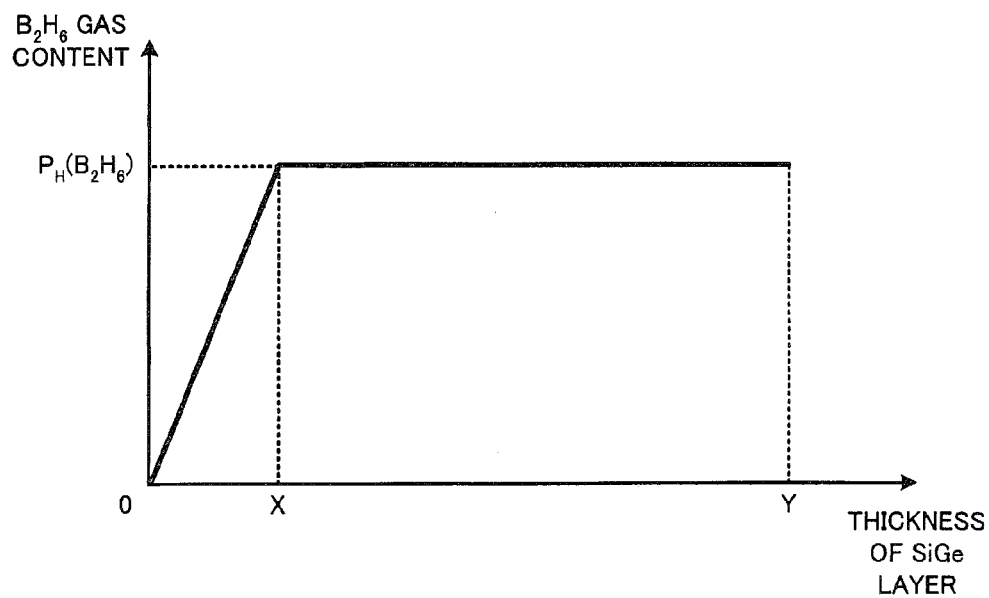
Figure 14:
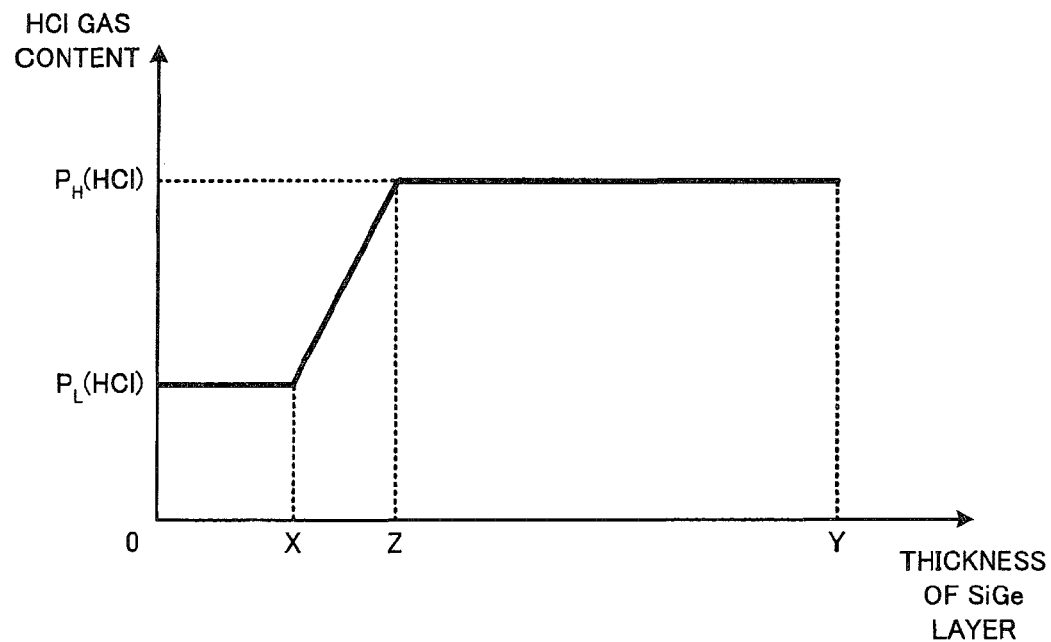
FIG. 14 is a view showing fourth examples of the sequences of an HCl gas content and a $B_2H_6$ gas content at the time of the growth of a SiGe layer.
Figure 14:
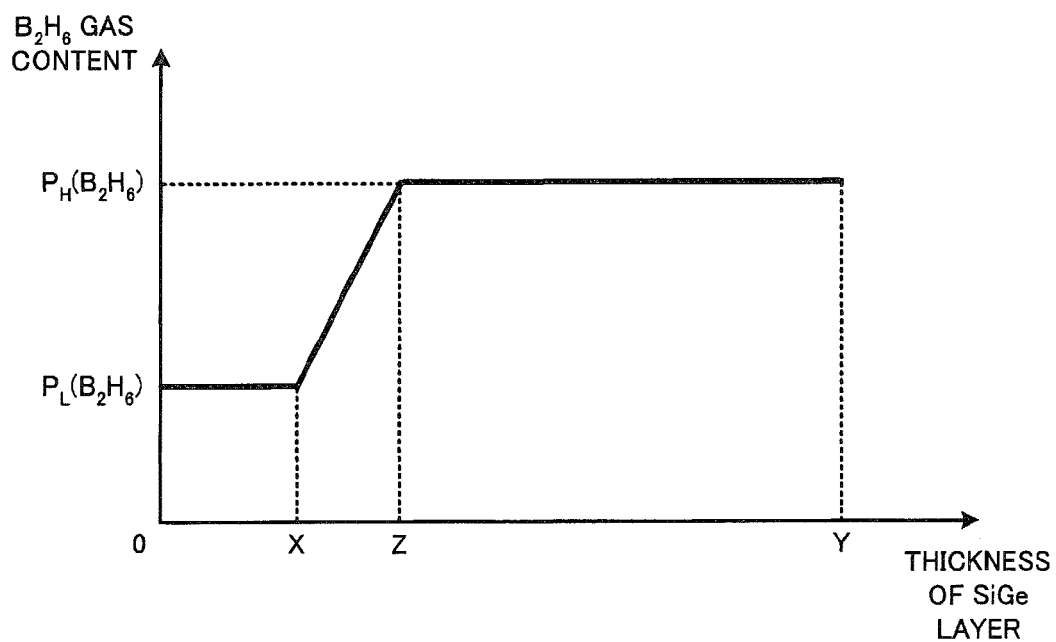

Each of FIGS. 12 through 14 is a view showing another example of the sequences of an HCl gas content and a $B_2H_6$ gas content at the time of the growth of a SiGe layer.

Sequences shown in FIG. 12 differ from the sequences shown in FIG. 11 in that $B_2H_6$ gas is not contained in the early stages of the growth of a SiGe layer (in the stages of the growth of a SiGe layer with a thickness of X). Sequences shown in FIG. 13 differ from the sequences shown in FIG. 11 in that an HCL gas content and a $B_2H_6$ gas content are gradually increased in the early stages of the growth of a SiGe layer (in the stages of the growth of a SiGe layer with a thickness of X). Sequences shown in FIG. 14 differ from the sequences shown in FIG. 11 in that an HCL gas content and a $B_2H_6$ gas content are gradually increased for a period from the end of the early stages of the growth of a SiGe layer (from the end of the stages of the growth of a SiGe layer with a thickness of X) to the growth of the SiGe layer with predetermined thickness (in the stages of the growth of the SiGe layer with a thickness of Z).

By using the sequences shown in FIG. 12, 13, or 14, growth selectivity in a lower layer portion of a SiGe layer is lower than growth selectivity in an upper layer portion of the SiGe layer. Therefore, deterioration in a roll-off characteristic can be suppressed. In addition, it is possible to make a SiGe layer selectively grow, while suppressing morphological deterioration.

Controlling the growth selectivity of a SiGe layer by controlling an HCL gas content has been described. Controlling the growth selectivity of a SiGe layer by controlling growth temperature will now be described.

Figure 15:
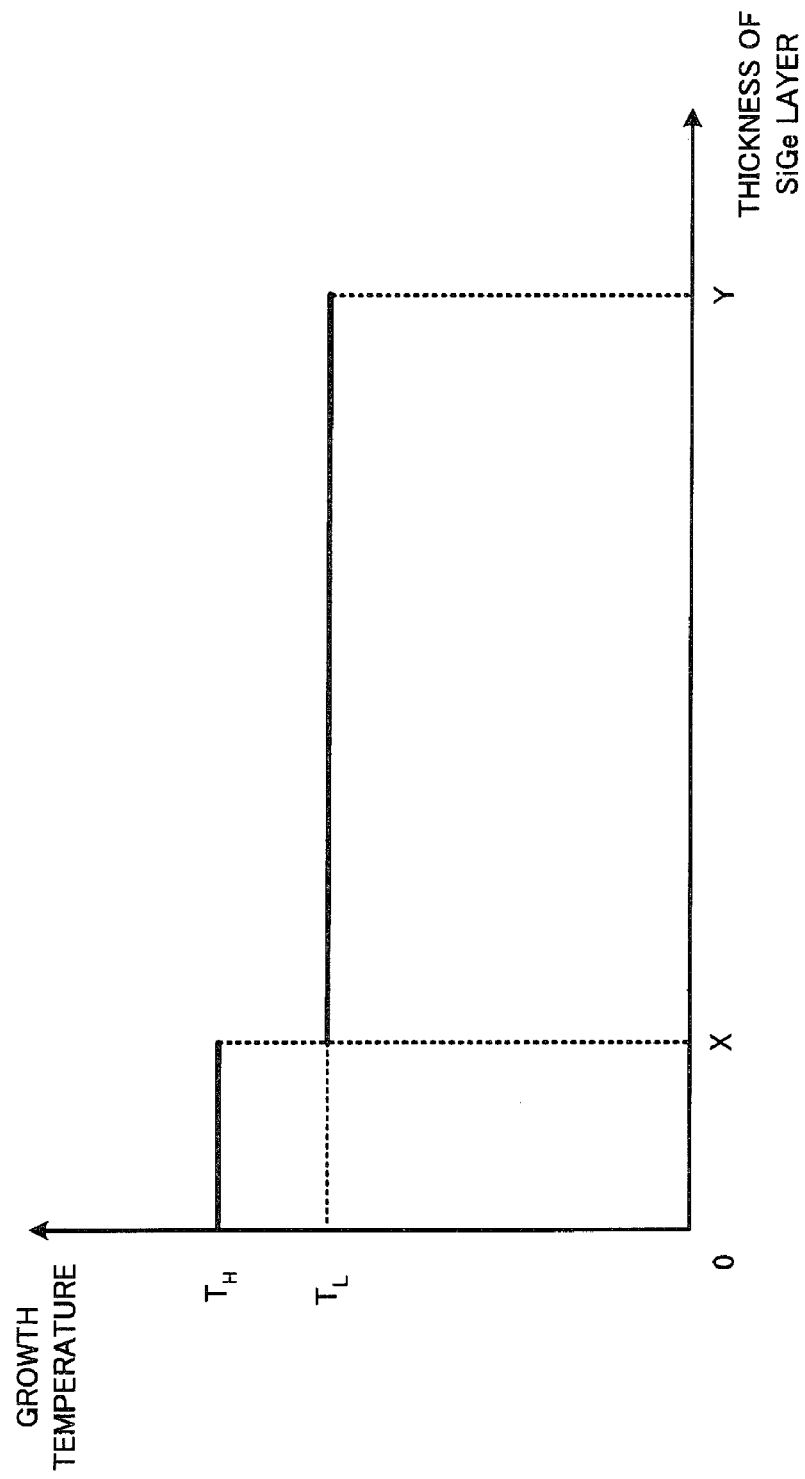
FIG. 15 is a view showing an example of the sequence of temperature at which a SiGe layer is made to grow.

FIG. 15 is a view showing an example of the sequence of temperature at which a SiGe layer is made to grow.

The sequence shown in FIG. 15 is applied to the pMOSFET fabrication process shown in FIGS. 1 through 6. With this sequence temperature at which a SiGe layer is made to grow (substrate temperature at CVD time) is changed when the lower layer portion 7a and the upper layer portion 7b are made to grow. By doing so, a SiGe layer with a total thickness of Y is made to grow. The lower layer portion 7a with a thickness of X is made to grow at growth temperature $T_L$ and the upper layer portion 7b with a thickness of (Y−X) is made to grow at growth temperature $T_H$. The growth temperature $T_L$ is set to, for example, 550 to 650° C. and the growth temperature $T_H$ is set to, for example, 450 to 550° C.

When two SiGe layers are made to grow at a high growth temperature and a low growth temperature respectively, the growth selectivity of the former with respect to insulating layers such as the side wall 5 is lower than the growth selectivity of the latter.

Therefore, as shown in FIG. 15, growth temperature is raised and the lower layer portion 7a is made to grow under the condition that growth selectivity is low. By doing so, the morphological deterioration of the lower layer portion 7a can be suppressed. After that, growth temperature is lowered and the upper layer portion 7b is made to grow on this lower layer portion 7a under the condition that growth selectivity is high. By doing so, the SiGe layer in which morphological deterioration is suppressed can be obtained. In addition, the formation of SiGe particles on the side wall 5 and the like can be suppressed.

Temperature at which the SiGe layer is made to grow is controlled in this way in order to set the condition that the growth selectivity of the lower layer portion 7a becomes lower than the growth selectivity of the upper layer portion 7b. By doing so, suppression of morphological deterioration and selective growth can be realized at the same time.

In the example taken in the above descriptions, the SiGe layer is divided into the two layer portions (lower layer portion and upper layer portion) and is made to grow. However, the SiGe layer may be divided into three or more layer portions and be made to grow. In this case, the above growth selectivity control should be exercised over any two adjacent layer portions, more particularly over a lowest layer portion and a layer portion thereon of the plurality of layer portions included in the SiGe layer. By doing so, the same effect that is described above can be obtained.

Furthermore, in the example taken in the above descriptions, the SiGe layer of the recessed source/drain pMOSFET is made to grow. However, the method for making the SiGe layer grow is also applicable to cases where other semiconductor layers are made to grow.

With a recessed source/drain n-channel MOSFET (nMOSFET), for example, a SiC layer is made to grow in recesses formed in a Si substrate as source/drain regions. An HCl gas content or growth temperature is controlled at the time of the growth of the SiC layer. By doing so, the growth selectivity of the SiC layer can be controlled. This is the same with the growth of the above SiGe layer. With the nMOSFET, the SiC layer made to grow should be doped with n-type impurities by, for example, the in-situ doping method.

A semiconductor layer over which a semiconductor layer is made to grow is not limited to the above Si substrate. A semiconductor layer may be made to grow over various semiconductor substrates including a compound semiconductor substrate or surface semiconductor layers such as a silicon on insulator (SOI) substrate.

In the present invention, the second semiconductor layer is formed over the first semiconductor layer which is exposed with the insulating layers under the condition that the growth selectivity of the lower layer portion is lower than the growth selectivity of the upper layer portion. By doing so, the second semiconductor layer having excellent morphology can selectively formed over the first semiconductor layer. As a result, a semiconductor device having excellent characteristics can stably be fabricated.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:

forming a gate electrode over a first semiconductor layer with a gate insulating film therebetween;

forming an insulating layer on sides of the gate electrode;

forming recesses in the first semiconductor layer using the gate electrode and the insulating layer as masks; and forming a second semiconductor layer having a first portion and a second portion above the first portion in the recesses, the first portion and the second portion being made under a condition that growth selectivity of the first portion with respect to the insulating layer is lower than growth selectivity of the second portion with respect to the insulating layer; wherein:

in the forming of the second semiconductor layer, halogen gas is added to material gas for the second semiconductor layer;

the first portion and the second portion are made under a condition that a content of the halogen gas at the time of the growth of the first portion is lower than a content of the halogen gas at the time of the growth of the second portion;

in the forming of the second semiconductor layer, temperature at the time of the growth of the first portion is set to 550 to 650° C. and temperature at the time of the growth of the second portion is set to 450 to 550° C., and the temperature at the time of the growth of the first portion is set higher than the temperature at the time of the growth of the second portion;

the first semiconductor layer is a silicon layer; and the first portion and the second portion of the second semiconductor layer are silicon germanium layers or silicon carbide layers.

2. The method according to claim 1, wherein:

the halogen gas and material gas for conduction impurities are added to the material gas for the second semiconductor layer; and the first portion and the second portion are made under a condition that a content of the material gas for the conduction impurities at the time of the growth of the first portion is lower than a content of the material gas for the conduction impurities at the time of the growth of the second portion.

3. The method according to claim 1, wherein:

the halogen gas is added to the material gas for the second semiconductor layer at the time of the growth of the first portion; and the halogen gas and material gas for conduction impurities are added to the material gas for the second semiconductor layer at the time of the growth of the second portion.

4. The method according to claim 1, wherein:

p-type impurities are contained in the second semiconductor layer;

the p-type impurities are boron; and boron concentration is $1 \times 10^{19}$ to $1 \times 10^{21}$ atoms/cm$^3$.

5. The method according to claim 1, wherein the halogen gas is HCl gas.

6. A method of forming a semiconductor device comprising:

forming a second semiconductor layer having a first portion and an second portion above the first portion on a first semiconductor layer which is exposed with an insulating layer, the first portion and the second portion being made under a condition that growth selectivity of the first portion with respect to the insulating layer is lower than growth selectivity of the second portion with respect to the insulating layer; wherein:

in the forming of the second semiconductor layer, halogen gas is added to material gas for the second semiconductor layer;

the first portion and the second portion are made under a condition that a content of the halogen gas at the time of the growth of the first portion is lower than a content of the halogen gas at the time of the growth of the second portion;

in the forming of the second semiconductor layer, temperature at the time of the growth of the first portion is set to 550 to 650° C. and temperature at the time of the growth of the second portion is set to 450 to 550° C., and the temperature at the time of the growth of the first portion is set higher than the temperature at the time of the growth of the second portion;

the first semiconductor layer is a silicon layer; and the first portion and the second portion of the second semiconductor layer are silicon germanium layers or silicon carbide layers.

7. The method according to claim 1, wherein the second semiconductor layer is formed in the recesses so that the first portion comes in direct contact with bottom and side surfaces of the recesses formed in the first semiconductor layer.

8. The method according to claim 6, wherein a bottom surface of the first portion comes in direct contact with the first semiconductor layer.

\* \* \* \* \*